United States Patent
Jeong

(10) Patent No.: US 8,168,987 B2
(45) Date of Patent: May 1, 2012

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 166 days.

(21) Appl. No.: 12/705,335

(22) Filed: Feb. 12, 2010

(65) Prior Publication Data

US 2010/0207158 A1    Aug. 19, 2010

(30) Foreign Application Priority Data

Feb. 16, 2009    (KR) .................. 10-2009-0012482

(51) Int. Cl.
*H01L 27/15* (2006.01)

(52) U.S. Cl. ............. 257/79; 257/94; 257/98; 257/99; 257/E33.001

(58) Field of Classification Search ............ 257/79, 257/91, 98, 99, E33.005–E33.007
See application file for complete search history.

(56) References Cited

U.S. PATENT DOCUMENTS

| | | | |
|---|---|---|---|
| 6,072,819 A | 6/2000 | Shakuda | |
| 6,242,761 B1 | 6/2001 | Fujimoto et al. | |
| 6,249,534 B1* | 6/2001 | Itoh et al. | 372/49.01 |
| 6,258,614 B1 | 7/2001 | Kaneko | |
| 7,057,211 B2* | 6/2006 | Dwilinski et al. | 257/97 |
| 7,252,712 B2* | 8/2007 | Dwilinski et al. | 117/68 |
| 7,355,208 B2* | 4/2008 | Hata et al. | 257/79 |
| 7,485,900 B2* | 2/2009 | Nonaka et al. | 257/99 |
| 7,786,502 B2* | 8/2010 | Sakai | 257/99 |
| 7,964,884 B2* | 6/2011 | Lee | 257/98 |
| 2003/0022406 A1 | 1/2003 | Liao et al. | |
| 2005/0247949 A1 | 11/2005 | Senda et al. | |
| 2007/0145381 A1 | 6/2007 | Unno et al. | |
| 2008/0220550 A1 | 9/2008 | Tomida | |

FOREIGN PATENT DOCUMENTS

| | | |
|---|---|---|
| EP | 1220335 A2 | 7/2002 |
| JP | 10-294521 A | 11/1998 |
| JP | 2000-216494 A | 8/2000 |
| JP | 2007-173530 A | 7/2007 |
| KR | 10-1995-0012790 A | 5/1994 |
| KR | 10-2005-0034970 A | 4/2005 |
| KR | 10-2005-0096007 A | 10/2005 |
| KR | 10-2006-0037029 A | 5/2006 |
| KR | 10-0673640 B1 | 1/2007 |

* cited by examiner

*Primary Examiner* — Kenneth Parker
*Assistant Examiner* — Jose R Diaz
(74) *Attorney, Agent, or Firm* — Birch, Stewart, Kolasch & Birch, LLP

(57) ABSTRACT

The embodiment discloses a semiconductor light emitting device. The semiconductor light emitting device includes a first conductive semiconductor layer; a first electrode layer below the first conductive semiconductor layer; a semiconductor layer at an outer peripheral portion of the first conductive semiconductor layer; an active layer on the first conductive semiconductor layer; a second conductive semiconductor layer on the active layer; and a second electrode layer on the second conductive semiconductor layer.

20 Claims, 14 Drawing Sheets

SEMICONDUCTOR LIGHT EMITTING DEVICE

CROSS-REFERENCE TO RELATED APPLICATIONS

The present application claims the benefit under 35 U.S.C. §119 of Korean Patent Application No. 10-2009-0012482, filed Feb. 16, 2009, which is hereby incorporated by reference in its entirety.

BACKGROUND

The embodiment relates to a semiconductor light emitting device and a method of manufacturing the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits signals by converting an electric signal into infrared ray or light using the characteristics of compound semiconductors. The LED is also used as a light source.

The LED or LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a semiconductor light emitting device and a method of manufacturing the same, capable of reducing current concentration onto an edge area of a first conductive semiconductor layer.

The embodiment provides a semiconductor light emitting device and a method of manufacturing the same, capable of reducing current transferred to an edge area of a first conductive semiconductor layer by forming a semiconductor layer having relatively low-concentration at an outer peripheral portion of the first conductive semiconductor layer.

According to an embodiment of the present invention, there is provided a semiconductor light emitting device comprising: a first conductive semiconductor layer; a first electrode layer below the first conductive semiconductor layer; a semiconductor layer at an outer peripheral portion of the first conductive semiconductor layer; an active layer on the first conductive semiconductor layer; a second conductive semiconductor layer on the active layer; and a second electrode layer on the second conductive semiconductor layer.

According to another embodiment of the present invention, there is provided a semiconductor light emitting device comprising: a first conductive semiconductor layer including a first electrode contact layer and a first conductive nitride layer on the first electrode contact layer; a first electrode layer below the first conductive semiconductor layer; a semiconductor layer at a lateral side of the first electrode contact layer and at an outer lower portion of the first conductive nitride layer; an active layer on the first conductive nitride layer; a second conductive semiconductor layer on the active layer; and a second electrode layer on the second conductive semiconductor layer.

According to still another embodiment of the present invention, there is provided a method of manufacturing a semiconductor light emitting device, the method comprising forming a first semiconductor layer on a substrate; forming a semiconductor layer on an outer peripheral portion of the first conductive semiconductor layer; forming an active layer on the first conductive semiconductor layer; forming a second conductive semiconductor layer on the active layer; and forming a second electrode layer on the second conductive semiconductor layer.

The embodiment can prevent current applied to a first electrode layer from being concentrated onto an edge area.

The embodiment can improve light emitting efficiency.

The embodiment can improve reliability of the semiconductor light emitting device.

DETAILED DESCRIPTION OF THE EMBODIMENTS

Figure 1:
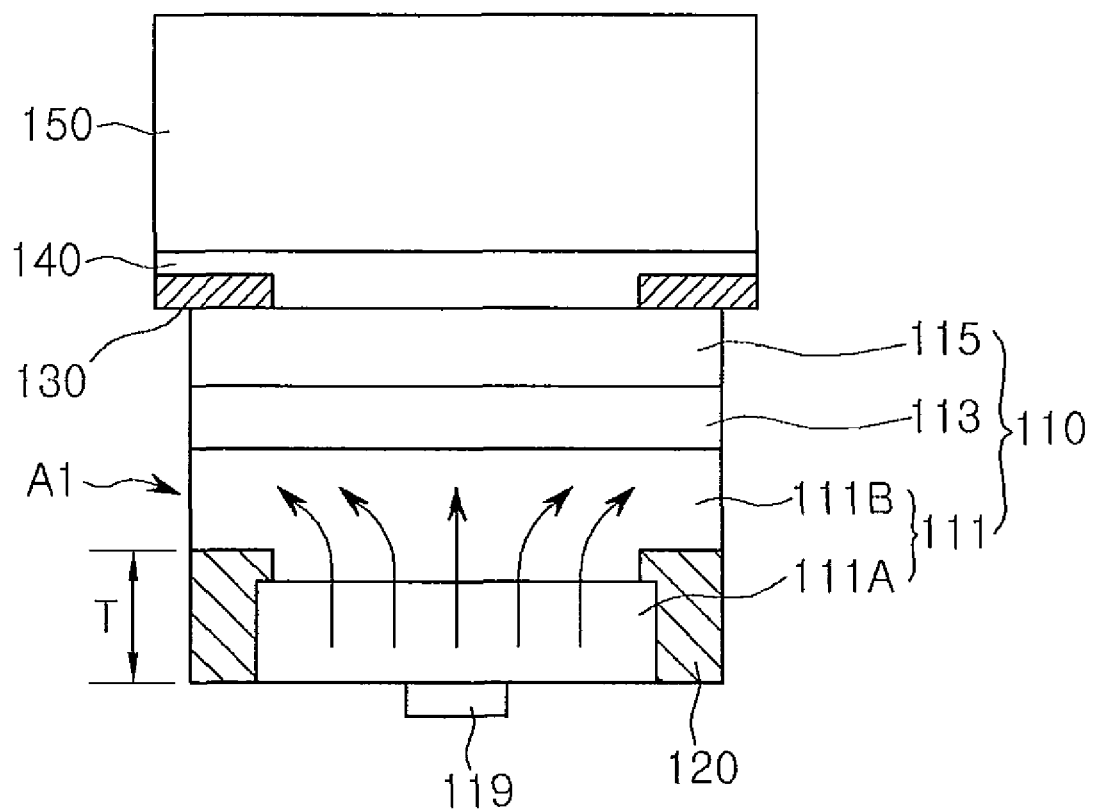
FIG. 1 is a sectional view showing a semiconductor light emitting device according to an embodiment.

In the description of the embodiments, it will be understood that, when a layer (or film), a area, a pattern, or a structure is referred to as being "on" or "under" another substrate, another layer (or film), another area, another pad, or another pattern, it can be "directly" or "indirectly" on the other substrate, layer (or film), area, pad, or pattern, or one or more intervening layers may also be present. Such a position of the layer has been described with reference to the drawings.

The thickness and size of each layer shown in the drawings can be exaggerated, omitted or schematically drawn for the purpose of convenience or clarity. In addition, the size of elements does not utterly reflect an actual size.

Hereinafter, the embodiments will be described with reference to the accompanying drawings.

Figure 2:
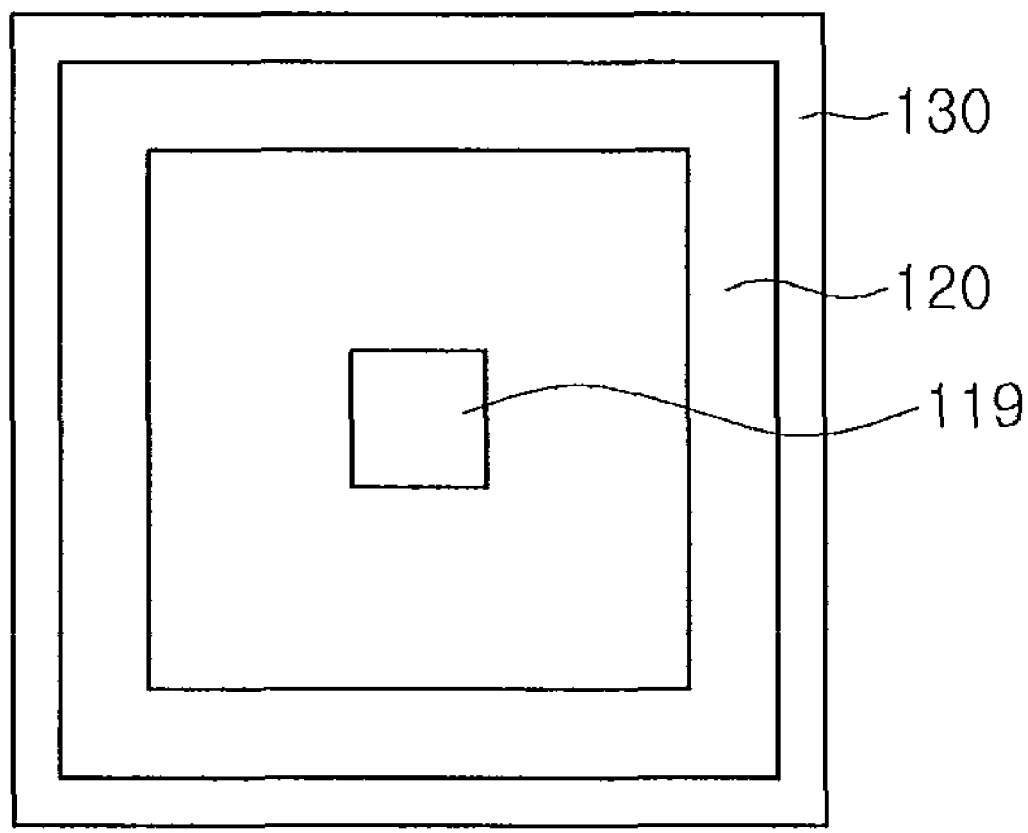
FIG. 2 is a bottom view of a semiconductor light emitting device according to an embodiment.

FIG. 1 is a sectional view showing a semiconductor light emitting device according to an embodiment, and FIG. 2 is a bottom view of a semiconductor light emitting device according to an embodiment.

Referring to FIGS. 1 and 2, the semiconductor light emitting device 100 according to the embodiment includes a light emitting structure 110, a semiconductor layer 120, a channel layer 130, a second electrode layer 140 and a conductive support member 150.

The light emitting structure 110 includes a first conductive semiconductor layer 111 having a first electrode contact layer 111A and a first conductive nitride layer 111B, an active layer 113, and a second conductive semiconductor layer 115. The active layer 113 is interposed between the first and second conductive semiconductor layers 111 and 115.

The first conductive semiconductor layer 111 may include both first electrode contact layer 111A and first conductive nitride layer 111B, or the first conductive nitride layer 111B may be omitted.

The first electrode contact layer 111A may include at least one semiconductor layer doped with a first conductive dopant. The first electrode contact layer 111A may include a group III-V compound semiconductor. For instance, the first electrode contact layer 111A may include at least one selected from the group consisting of GaN, InN, AlN, InGaN, AlGaN, InAlGaN and AlInN. If the first electrode contact layer 111A is an N type semiconductor layer, the first conductive dopant is an N type dopant. For instance, the N type dopant can be selected from the group consisting of Si, Ge, Sn, Se and Te.

A first electrode layer 119 having a predetermined pattern can be disposed under the first electrode contact layer 111A. The first electrode layer 119 may have a circular pattern, a polygonal pattern or a pattern having a branch structure. A roughness having concave-convex configuration can be formed on a part or a whole area of the bottom surface of the first electrode contact layer 111A.

The first conductive nitride layer 111B is formed on the first electrode contact layer 111A. The first conductive nitride layer 111B may include at least one semiconductor layer doped with a first conductive dopant. The first conductive nitride layer 111B may include a group III-V compound semiconductor. For instance, the first conductive nitride layer 111B may include at least one selected from the group consisting of GaN, InN, AlN, InGaN, AlGaN, InAlGaN and AlInN. If the first conductive nitride layer 111B is an N type semiconductor layer, the first conductive dopant is an N type dopant. For instance, the N type dopant can be selected from the group consisting of Si, Ge, Sn, Se and Te.

The semiconductor layer 120 is formed at an outer peripheral portion of the first electrode contact layer 111A. The semiconductor layer 120 may be a lightly doped semiconductor layer or an undoped semiconductor layer. The semiconductor layer 120 may include at least one selected from the group consisting of GaN, InN, AlN, InGaN, AlGaN, InAlGaN and AlInN. The semiconductor layer 120 is disposed at a lateral side of the first electrode contact layer 111A and an outer lower portion of the first conductive nitride layer 111B.

The thickness T of the semiconductor layer 120 may be less than the thickness of the first electrode contact layer 111A. In addition, the thickness T of the semiconductor layer 120 may be equal to or greater than the thickness of the first electrode contact layer 111A. The semiconductor layer 120 may have the thickness reaching the upper portion of the first conductive nitride layer 111B. Further, the first electrode contact layer 111A is spaced apart from the active layer 113 by a predetermined distance.

The first electrode contact layer 111A and the first conductive nitride layer 111B may have carrier concentration higher than that of the semiconductor layer 120. That is, the semiconductor layer 120 has a carrier concentration lower than a carrier concentration of the first conductive semiconductor layer 111. For instance, the carrier concentration of the first electrode contact layer 111A and the first conductive nitride layer 111B is $5 \sim 9 \times 10^{18}$ cm$^{-3}$ or above. The carrier concentration of the semiconductor layer 120 is lower than the carrier concentration of the first electrode contact layer 111A and the first conductive nitride layer 111B. For instance, the carrier concentration of the semiconductor layer 120 is $1 \sim 5 \times 10^{15}$ cm$^{-3}$ or below.

In addition, the semiconductor layer 120 may be doped with a first conductive dopant at low concentration. The semiconductor layer 120 can be additionally doped with a second conductive dopant or the semiconductor layer 120 may not be doped with the conductive dopant.

The active layer is formed on the first conductive nitride layer 111B. The active layer 113 has a single quantum well structure or a multiple quantum well (MQW) structure. The active layer 113 may have a stack structure including a well layer and a barrier layer, which are made from group III-V compound semiconductor material. For instance, the active layer 113 has a stack structure of InGaN well/GaN barrier layers or AlGaN well/GaN barrier layers.

The active layer 113 is made from material having band gap energy according to wavelength of light to be emitted. For instance, in the case of blue light having wavelength of 460 to 470 nm, the active layer 113 has a single quantum well structure or a multiple quantum well structure including the InGaN well/GaN barrier layers. The active layer 113 may include material capable of providing light of visible ray band, such as blue light, red light and green light.

A conductive clad layer may be formed on and/or under the active layer. The conductive clad layer may include an AlGaN layer.

The second conductive semiconductor layer 115 is disposed on the active layer 113. The second conductive semiconductor layer 115 includes at least one semiconductor layer doped with the second conductive dopant. The second conductive semiconductor layer 115 may include a group III-V compound semiconductor. For instance, the second conductive layer 115 may include at least one selected from the group consisting of GaN, InN, AlN, InGaN, AlGaN, InAlGaN and AlInN. If the second conductive semiconductor layer is a P type semiconductor layer, the second conductive dopant is a P type dopant. For instance, the P type dopant can be selected from the group consisting of Mg, Zn, Ca, Sr and Ba.

A third conductive semiconductor layer (not shown) is formed on the second conductive semiconductor layer 115. If the first conductive semiconductor layer 111 is a P type semiconductor layer, the second conductive semiconductor layer 115 is an N type semiconductor layer. The third conductive semiconductor layer may be doped with the first conductive dopant. The light emitting structure 110 may include one of an N-P junction structure, a P-N junction structure, an N-P-N junction structure, and a P-N-P junction structure.

The channel layer 130 and the second electrode 140 are aligned on the second conductive semiconductor layer 115.

An inner portion of the channel layer 130 is disposed on the second conductive semiconductor layer 115 along an outer peripheral portion of the second conductive semiconductor layer 115. An outer portion of the channel layer 130 extends out of the second conductive semiconductor layer 115 so that the outer portion of the channel layer 130 is exposed at an outer area A1 of the light emitting structure 110. The channel layer 130 may be formed on a boundary area of the top of the second electrode layer 140. That is, the channel layer 130 may be formed on the boundary area between the light emitting structure 110 and the second electrode layer 140. The channel layer 130 may be disposed between an outer upper portion of the second conductive semiconductor layer 115 and the second electrode layer 140. The channel layer 130 may be formed of a conductive channel layer using a conductive material or a non-conductive channel layer using a non-conductive material.

The conductive channel layer may be formed of a transparent conductive oxide layer or may include at least one of Ti, Ni, Pt, Pd, Rh, Ir, and W. For example, the transparent conductive oxide layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO).

In addition, if isolation etching is performed on the light emitting structure 110 to separate the light emitting structure 110 by a unit chip without the channel layer 121 during a chip separation process, fragments are generated from the second electrode layer 130. The fragments are attached between the second conductive semiconductor layer 115 and the active layer 113 or between the active layer 113 and the first conductive semiconductor layer 111, such that electrical short may occur. Accordingly, the conductive protective layer is formed of a material that is not cracked or does not generate fragments during isolation etching. Therefore, the fragments of the second electrode layer 130 are not generated and the electrical short is not occurred.

In other words, the channel layer 130 may include conductive material or insulating material having light transmittive property. The channel layer 130 is prepared in the form of a frame and is disposed between an outer portion of the second conductive semiconductor layer 115 and the second electrode layer 140.

The channel layer 130 may include insulating material selected from the group consisting of ZnO, $SiO_2$, $SiO_x$, $SiO_xN_y$, $Si_3N_4$, $Al_2O_3$ and $TiO_2$. When the channel layer 130 includes the insulating material, the gap between the second electrode layer 140 and the light emitting structure 110 can be widened.

The channel layer 130 may partially overlap the light emitting structure 110 in a vertical direction. The channel layer 130 may partially overlap the semiconductor layer 120 in a vertical direction.

The channel layer 130 increases the distance of the side between the second electrode layer 140 and the active layer 113. Accordingly, probability that electrical short occurs between the second electrode layer 140 and the active layer 113 can be reduced.

A partial top of the channel layer 130 may be exposed by the isolation etching. Accordingly, the channel layer 130 may contact a partial area of the light emitting structure 110 in a vertical direction and the remaining portion may not contact the light emitting structure 110 in a vertical direction.

The second electrode layer 140 is formed on the second conductive semiconductor layer 115 and the channel layer 130. The second electrode layer 140 includes at least one layer including at least one selected from the group consisting of Ag, Ni, Al, Rh, Pd, Ir, Ru, Mg, Zn, Pt, Au, Hf and combination thereof.

An ohmic layer (not shown) having a predetermined pattern can be formed between the second electrode layer 140 and the second conductive semiconductor layer 115. The ohmic layer may have a matrix pattern, a cross pattern, a polygonal pattern or a circular pattern. The ohmic layer may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide) and ATO (antimony tin oxide). The light emitting structure 110 may be formed on the ohmic contact layer and the channel layer 130.

The conductive support member 150 is formed on the second electrode layer 140. That is, the conductive support member 150 may be disposed on the second electrode layer 140. The conductive support member 150 may include material selected from the group consisting of copper, gold, and carrier wafers (for instance, Si, Ge, GaAs, ZnO, and SiC).

FIGS. 3 to 14 are sectional views showing the procedure for manufacturing the semiconductor light emitting device according to the embodiment.

Figure 3:
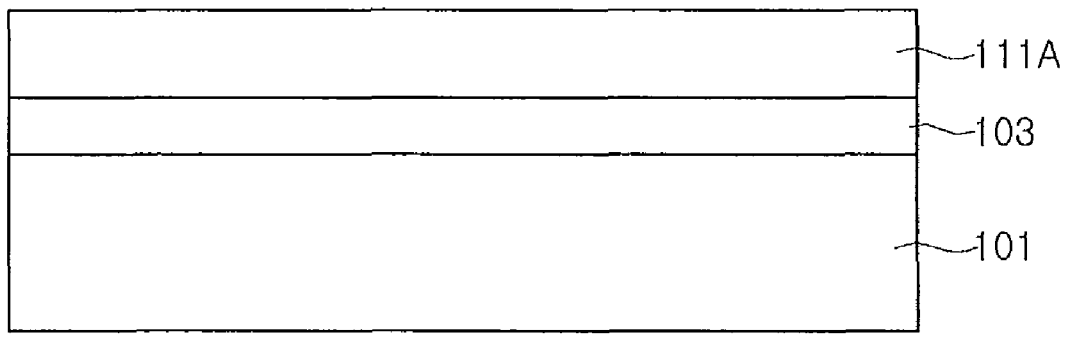
FIGS. 3 to 14 are sectional views showing the procedure for manufacturing a semiconductor light emitting device according to an embodiment.

Referring to FIG. 3, a buffer layer 103 is formed on a substrate 101, and the first electrode contact layer 111A is formed on the buffer layer 103.

The substrate 101 may include material selected from the group consisting of $Al_2O_3$, GaN, SiC, ZnO, Si, GaP, InP or GaAs. A predetermined concave-convex pattern can be formed on the substrate 101.

A nitride semiconductor can be grown on the substrate 101. In this case, growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment. For instance, the nitride semiconductor may include a compound semiconductor having a chemical formula of $In_xAl_yGa_{1-x-y}N$ ($0 \leq x \leq 1$, $0 \leq y \leq 1$, and $0 \leq x+y \leq 1$).

The buffer layer 103 is formed on the substrate 101. The buffer layer 103 attenuates the lattice mismatch between the semiconductor layer to be grown on the buffer layer 103 and the substrate 101. For instance, the buffer layer 103 attenuates the lattice mismatch between the GnN layer to be grown on the buffer layer 103 and the substrate 101. The buffer layer may include at least one selected from the group consisting of GaN, InN, AlN, InGaN, AlGaN, InAlGaN and AlInN. An undoped semiconductor layer (not shown) or another semiconductor layer can be formed on the buffer layer 103. The undoped semiconductor layer may include an undoped GaN layer, which is not doped with the first or second conductive dopant. The buffer layer 103 and/or the undoped semiconductor layer may be omitted or may not exist in the resulted device.

The first electrode contact layer 111A includes at least one semiconductor layer doped with the first conductive dopant. The first electrode contact layer 111A may include a group III-V compound semiconductor. For instance, the first electrode contact layer 111A may include at least one selected from the group consisting of GaN, InN, AlN, InGaN, AlGaN, InAlGaN and AlInN. If the first electrode contact layer 111A is an N type semiconductor layer, the first conductive dopant is an N type dopant. For instance, the N type dopant can be selected from the group consisting of Si, Ge, Sn, Se and Te.

If the first electrode contact layer 111A is an N—GaN layer, the N type dopant, silane gas including the N type dopant, such as $NH_3$, TMGa (or TEGa) or Si, is supplied to form the N type GaN layer having a predetermined thickness.

Figure 4:
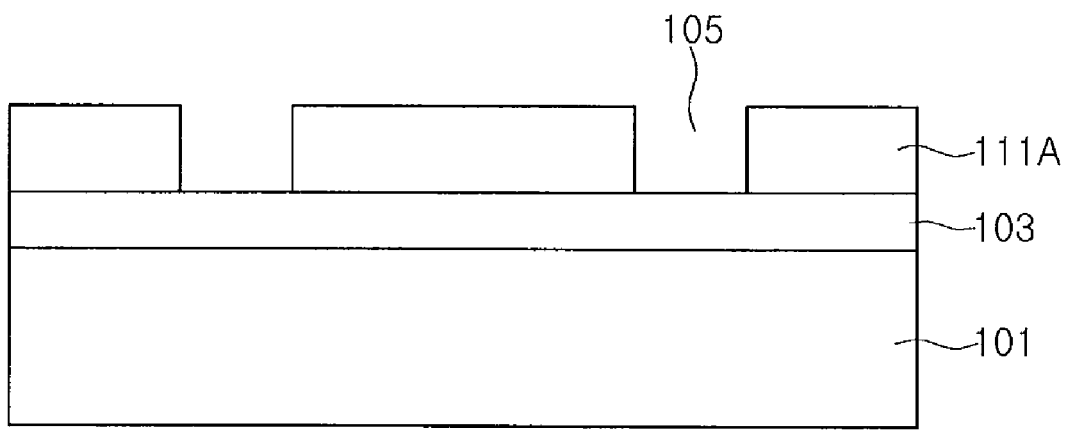
Figure 5:
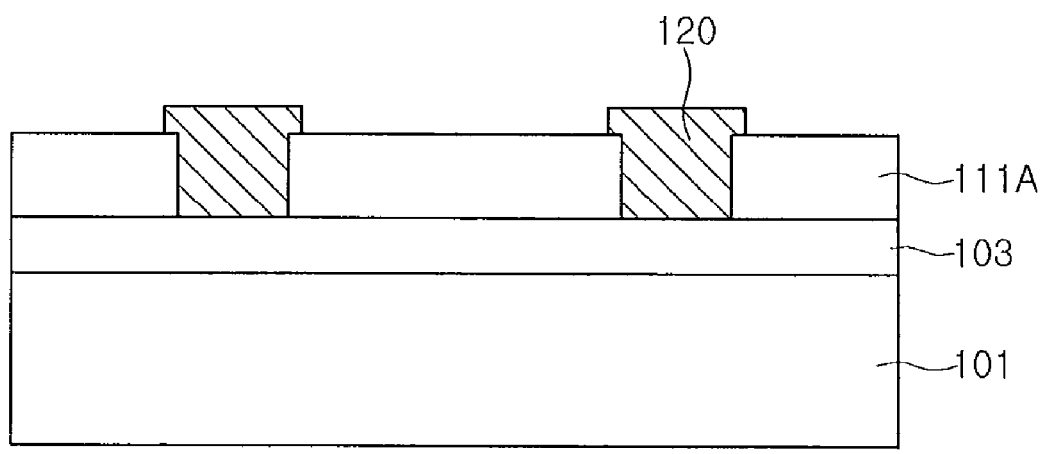
Figure 6:
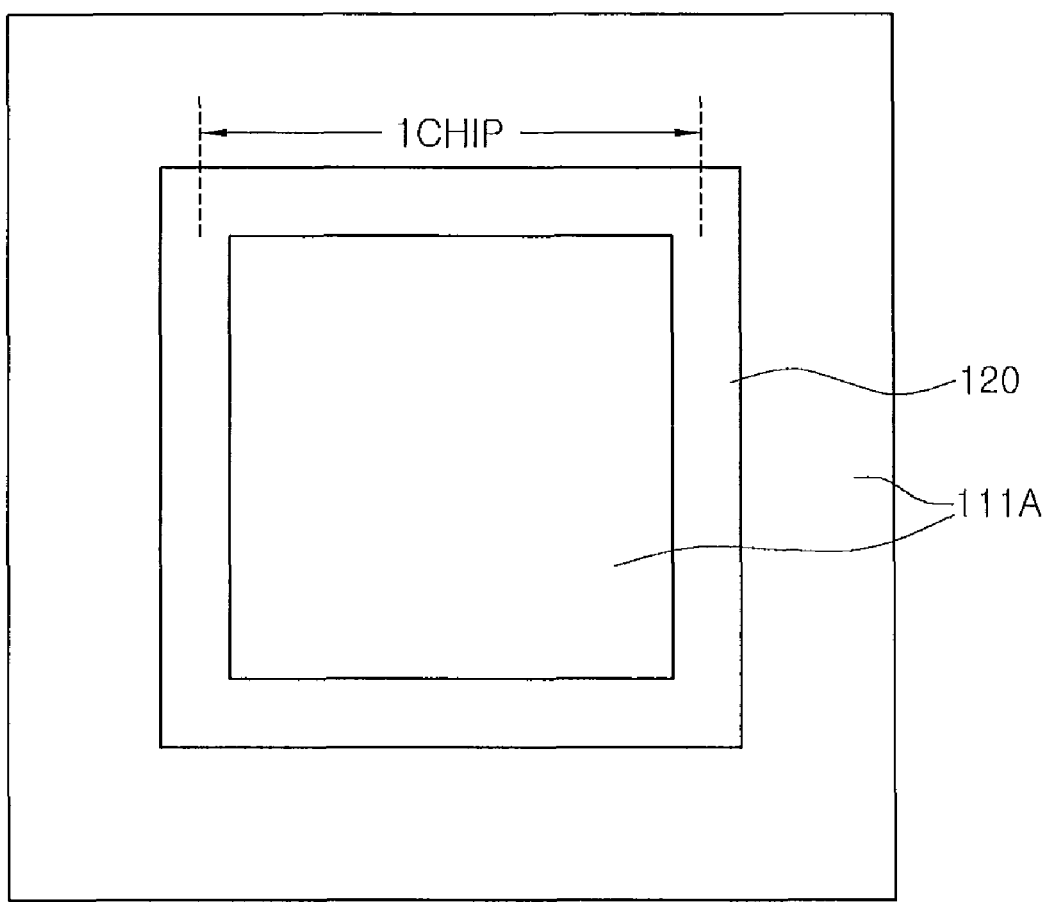

Referring to FIGS. 4 to 6, a recess 105 is formed in the first electrode contact layer 111A to form the semiconductor layer 120. The recess 105 can be formed by etching a chip boundary area through a dry etching using a mask pattern. A depth of the recess 105 is equal to or more than the thickness of the first electrode contact layer 111A, but the embodiment is not limited thereto. The recess 105 can be prepared in the form of a strip along the chip boundary area.

The semiconductor layer 120 is formed in the recess 105 of the first electrode contact layer 111A. The semiconductor layer 120 may be a lightly doped semiconductor layer or an undoped semiconductor layer. The semiconductor layer 120 may include at least one selected from the group consisting of GaN, InN, AlN, InGaN, AlGaN, InAlGaN and AlInN. If the semiconductor layer 120 is an undoped GaN layer, the semiconductor layer 120 can be formed by supplying $NH_3$ or TMGa (or TEGa).

The semiconductor layer 120 has carrier concentration lower than that of the first electrode contact layer 111A. If the first electrode contact layer 111A has normal carrier concentration, the semiconductor layer 120 has low carrier concentration or the semiconductor layer 120 is undoped. In addition, if the first electrode contact layer 111A has high carrier concentration, the semiconductor layer 120 has low carrier concentration or the semiconductor layer 120 is undoped.

For instance, the carrier concentration of the first electrode contact layer 111A is $5\sim9\times10^{18}$ cm$^{-3}$ or above. The carrier concentration of the semiconductor layer 120 is lower than the carrier concentration of the first electrode contact layer 111A. For instance, the carrier concentration of the semiconductor layer 120 is $1\sim5\times10^{15}$ cm$^{-3}$ or below.

That is, the semiconductor layer 120 is doped with the first conductive dopant at low concentration or doped with the second conductive dopant. In addition, the semiconductor layer 120 may not be doped with the conductive dopant.

Figure 7:
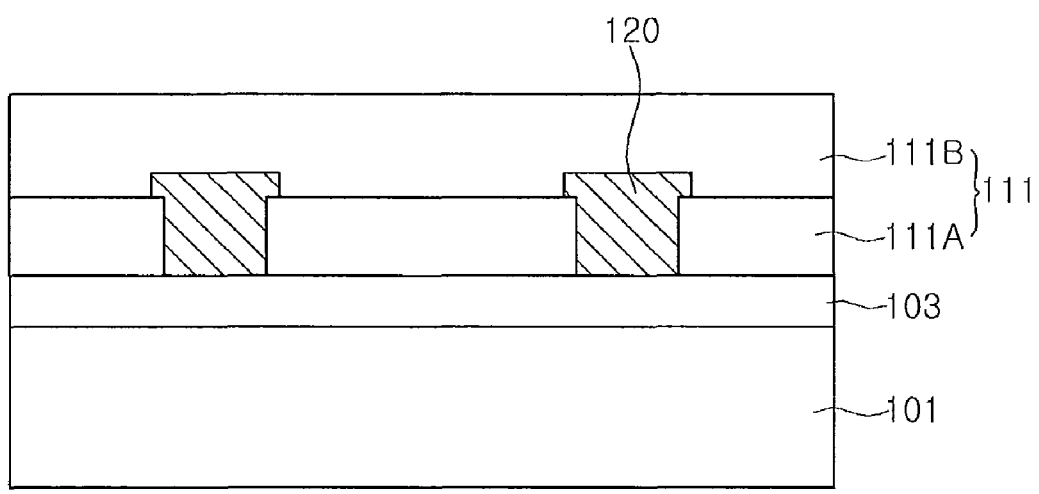

Referring to FIGS. 5 to 7, the first conductive nitride layer 111B is formed on the first electrode contact layer 111A and the semiconductor layer 120. The first conductive nitride layer 111B may include at least one semiconductor layer doped with the first conductive dopant. The first conductive nitride layer 111B may include a group III-V compound semiconductor. For instance, the first conductive nitride layer 111B may include at least one selected from the group consisting of GaN, InN, AlN, InGaN, AlGaN, InAlGaN and AlInN. If the first conductive nitride layer 111B is an N type semiconductor layer, the first conductive dopant is an N type dopant. For instance, the N type dopant can be selected from the group consisting of Si, Ge, Sn, Se and Te.

The first conductive nitride layer 111B may include the semiconductor material identical to or different from the first electrode contact layer 111A and the embodiment is not limited thereto. The carrier concentration of the first conductive nitride layer 111B is higher than that of the semiconductor layer 120. For instance, the first conductive nitride layer 111B has the carrier concentration of $5\sim9\times10^{18}$ cm$^{-3}$ or above.

The first conductive nitride layer 111B may be omitted. In this case, the first electrode contact layer 111A has relatively large thickness and the semiconductor layer 120 has thickness corresponding to $½\sim⅗$ thickness of the first electrode contact layer 111A. In addition, the top surface of the semiconductor layer 120 may be sealed by the nitride semiconductor layer (for instance, the first conductive semiconductor layer).

Figure 8:
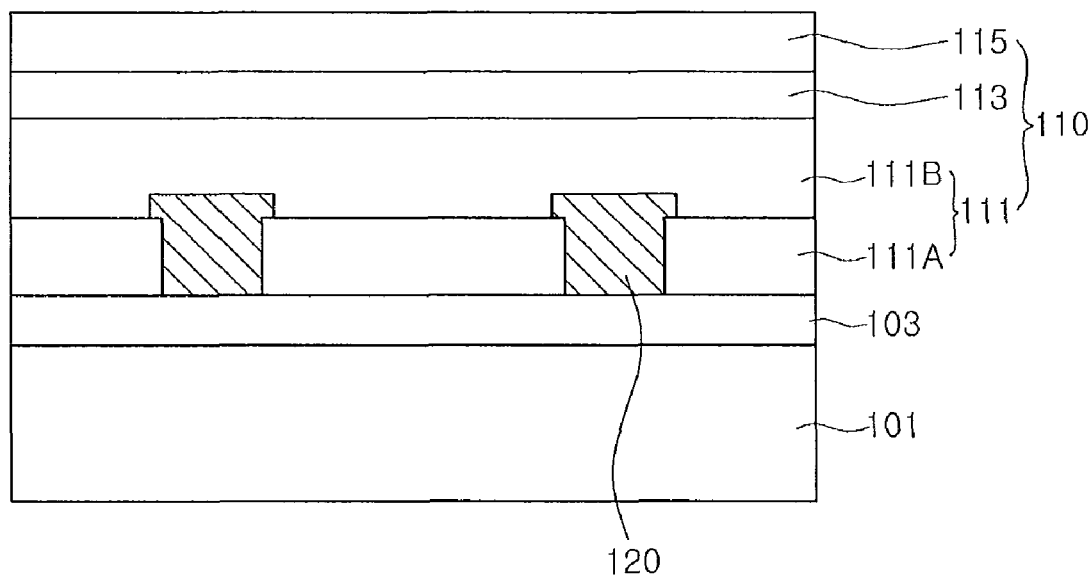

Referring to FIG. 8, the active layer 113 is formed on the first conductive nitride layer 111B of the first conductive semiconductor layer 111, and the second conductive semiconductor layer 115 is formed on the active layer 113.

The active layer 113 has a single quantum well structure or a multiple quantum well (MQW) structure. The active layer 113 may have a stack structure including a well layer and a barrier layer, which are made from group III-V compound semiconductor material. For instance, the active layer 113 has a stack structure of InGaN well/GaN barrier layers or AlGaN well/GaN barrier layers.

A conductive clad layer may be formed on and/or under the active layer. The conductive clad layer may include an AlGaN layer.

The second conductive semiconductor layer 115 includes at least one semiconductor layer doped with the second conductive dopant. The second conductive semiconductor layer 115 may include a group III-V compound semiconductor. For instance, the second conductive layer 115 may include at least one selected from the group consisting of GaN, InN, AlN, InGaN, AlGaN, InAlGaN and AlInN. If the second conductive semiconductor layer 115 is a P type semiconductor layer, the second conductive dopant is a P type dopant. For instance, the P type dopant can be selected from the group consisting of Mg, Zn, Ca, Sr and Ba.

A third conductive semiconductor layer (not shown) is formed on the second conductive semiconductor layer 115. If the first conductive semiconductor layer 111 is a P type semiconductor layer, the second conductive semiconductor layer 115 is an N type semiconductor layer. The third conductive semiconductor layer may be doped with the first conductive dopant. The light emitting structure 110 may include one of an N-P junction structure, a P-N junction structure, an N-P-N junction structure, and a P-N-P junction structure.

Figure 9:
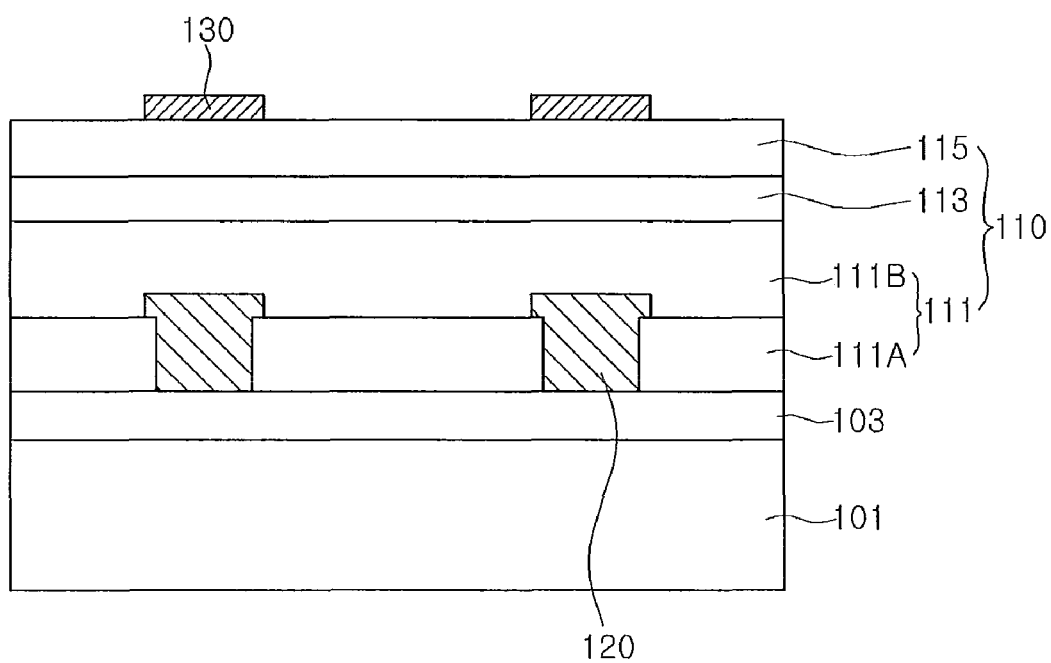

Referring to FIG. 9, the channel layer 130 is formed on the top surface of the second conductive semiconductor layer 115. The channel layer 130 may include one selected from the group consisting of ITO, IZO, IZTO, IAZO, IGZO, IGTO, AZO, ATO, SiO$_2$, SiO$_x$, SiO$_x$N$_y$, Si$_3$N$_4$, Al$_2$O$_3$ and TiO$_2$.

The channel layer 130 is prepared in the form of a frame at an edge area of the second conductive semiconductor layer 115 of the chip. The channel layer may include light transmittive material or insulating material.

In other words, the channel layer 130 may be selectively formed on the light emitting structure 110, being corresponding to a unit chip area.

The channel layer 130 may be formed on a boundary of the unit chip area using a mask pattern. The channel layer 130 may be formed using various deposition methods such as a sputtering method.

Figure 10:
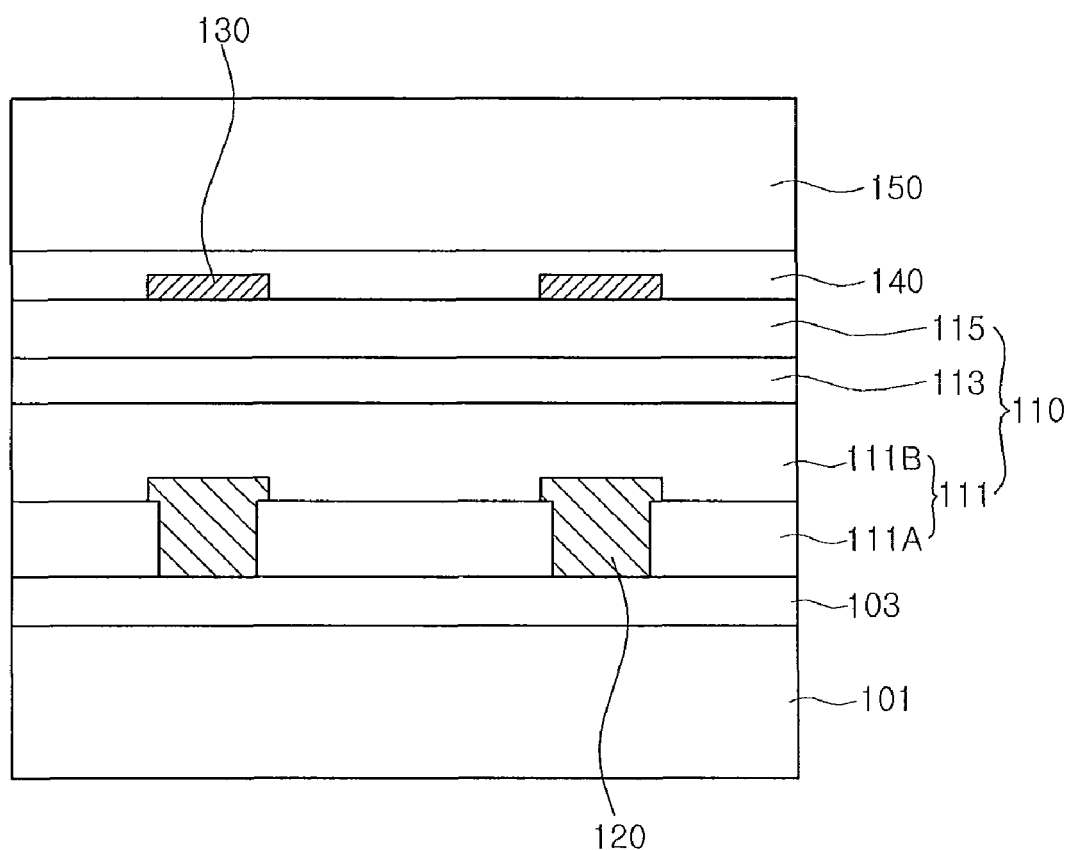

Referring to FIGS. 9 and 10, the second electrode layer 140 is formed on the channel layer 130 and the second conductive semiconductor layer 115, and the conductive support member 150 is formed on the second electrode layer 140.

The second electrode layer 140 and the conductive support member 150 are conductive layers that serve as a second electrode. An ohmic pattern (not shown) having a predetermined pattern can be formed between the second conductive semiconductor layer 115 and the second electrode layer 140.

The second electrode layer 140 may include at least one layer including at least one selected from the group consisting of Ag, Ni, Al, Rh, Pd, Ir, Ru, Mg, Zn, Pt, Au, Hf and combination thereof, but the embodiment is not limited thereto. The conductive support member 150 may include material selected from the group consisting of copper, gold, and carrier wafers (for instance, Si, Ge, GaAs, ZnO, and SiC), but the embodiment is not limited thereto.

Figure 11:
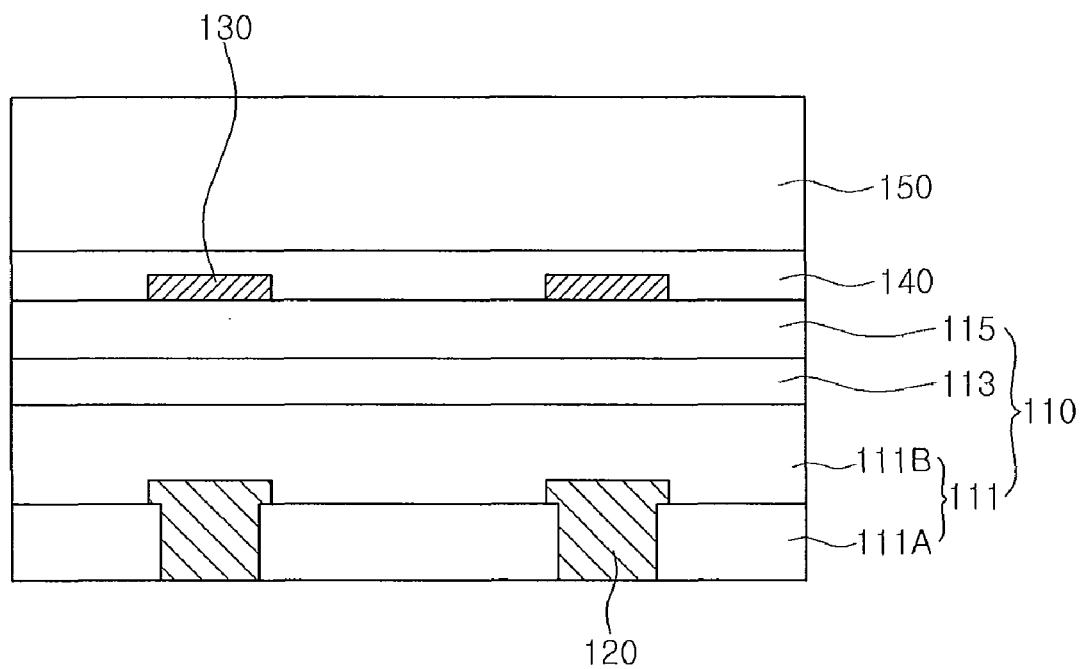

Referring to FIGS. 10 and 11, the substrate 101 disposed below the first electrode contact layer 111A is removed. For instance, the substrate 101 can be removed through the laser lift off (LLO) scheme. That is, if the laser having a predetermined wavelength band is irradiated onto the substrate 101, thermal energy is concentrated on the boundary surface between the substrate 101 and the first electrode contact layer 111A, so that the substrate 101 is separated from the first electrode contact layer 111A. After removing the substrate 101, the buffer layer 103 is removed through an etching scheme.

The substrate 101 can be removed through another scheme. For instance, if the buffer layer 103 exists between the substrate 101 and the first conductive semiconductor layer 111, wet etchant is injected into the buffer layer 103 to remove the buffer layer 103, thereby removing the substrate 101.

After the substrate 101 has been removed, the bottom surface of the first electrode contact layer 111A polished through the ICP/RIE (inductively coupled plasma/reactive ion etching) scheme.

Figure 12:
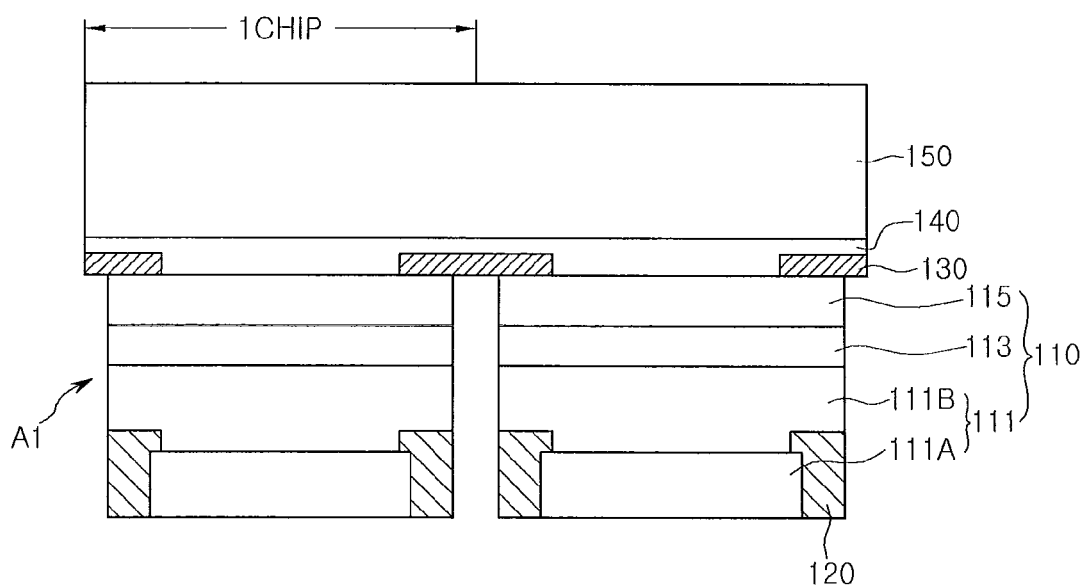
Figure 13:
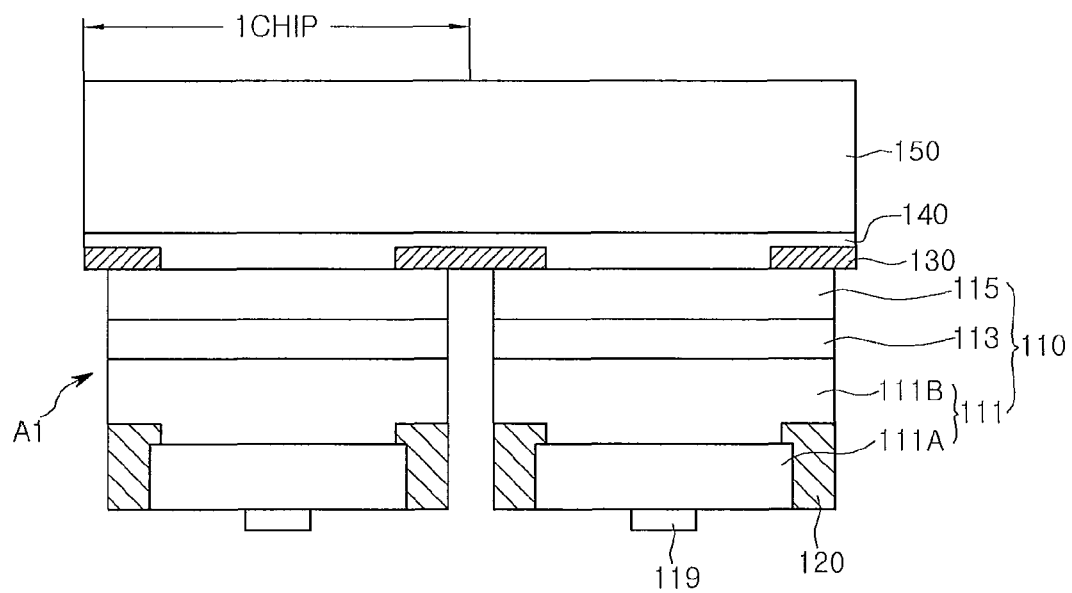
Figure 14:
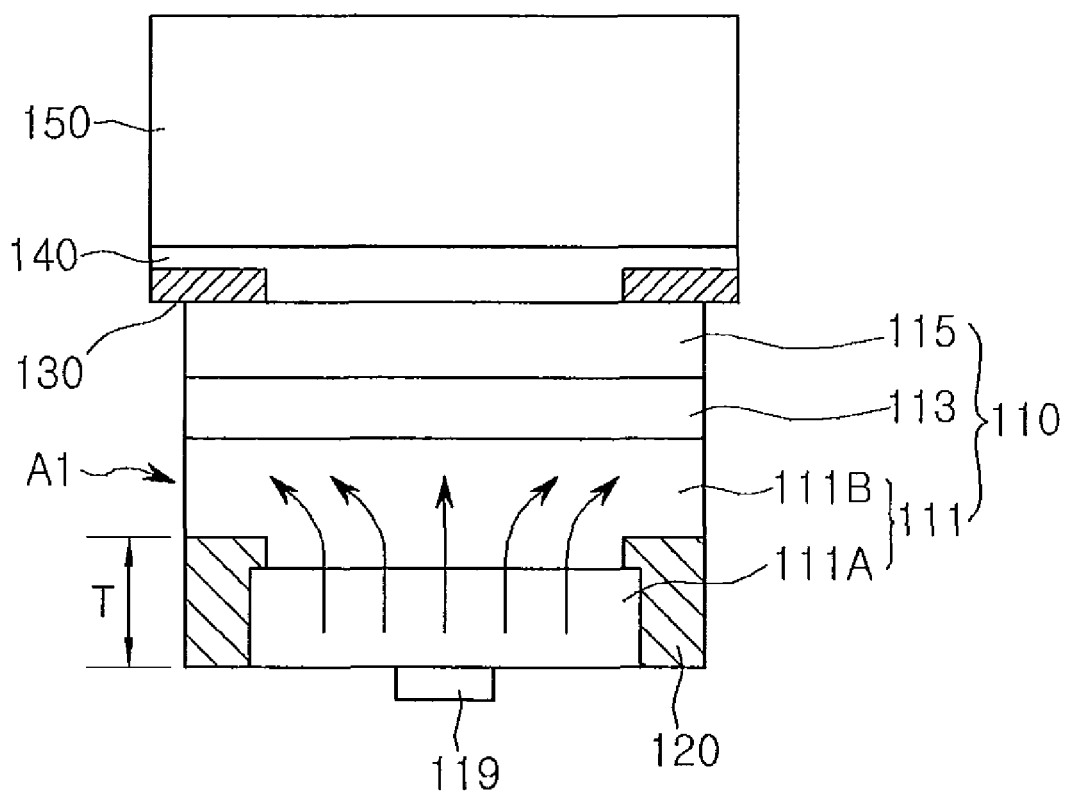

Referring to FIGS. 12 and 13, after the substrate 101 has been removed, a mesa etching is performed to expose an outer lower portion of the channel layer 130 at the chip boundary area. The mesa etching may be the dry etching or the wet etching. At this time, the outer area A1 of the light emitting structure 110 is cut.

If the channel layer 130 includes conductive material, the light emitting efficiency can be improved due to the ohmic characteristic of the channel layer 130. If the channel layer 130 includes insulating material, the gap between the second electrode 140 and the second conductive semiconductor layer 114 can be widened.

The first electrode layer 119 having a predetermined pattern can be formed below the first electrode contact layer 111A. The concave-convex roughness can be formed on the bottom surface of the first electrode contact layer 111A. After or before the first electrode layer 119 has been formed, a dicing process is performed to provide individual chips.

If forward power is supplied to the semiconductor light emitting device 100, power is applied to the first electrode layer 119 and the conductive support member 150. The first electrode contact layer 111A of the light emitting structure 110 is formed at an outer peripheral portion thereof with the semiconductor substrate 120. Thus, current may not flow to an edge (that is, an outer peripheral portion) of the first electrode contact layer 111A, but flow to the active layer 120 through the first conductive nitride layer 111B. The semiconductor light emitting device according to the embodiment can minimize the current flowing through the edge of the device, so that the light emitting efficiency and reliability of the device can be improved.

The semiconductor light emitting device according to the embodiments can be applied to various devices, such as a light emitting device package, a backlight unit, and an illumination device.

The light emitting device package may include a body, a first lead electrode, a second lead electrode, a semiconductor light emitting device according to the embodiments, and a molding member.

The first lead electrode and the second lead electrode may be disposed at the body. The semiconductor light-emitting device may be electrically connected to the first lead electrode and the second lead electrode. The molding member may be configured to mold the semiconductor light emitting device.

The body may be formed to include, for example, silicon material, synthetic resin, or metallic material, and an inclined surface may be formed around the semiconductor light emitting device. The first lead electrode and the second lead electrode may be electrically disconnected from each other, and may provide power to the semiconductor light emitting device. Also, the first lead electrode and the second lead electrode may reflect light emitted from the semiconductor light emitting device, thus increasing light efficiency. Also, the first lead electrode and the second lead electrode may serve to discharge heat generated by the semiconductor light emitting device.

The semiconductor light emitting device may be disposed on the body, or may be disposed on the first lead electrode or the second lead electrode. The semiconductor light emitting device may be electrically connected by, for example, a wire to the first lead electrode, and may be connected to the second lead electrode in, for example, a die-bonding configuration.

The molding member may mold the semiconductor light emitting device to protect the semiconductor light emitting device. Also, a fluorescent material may be included in the molding member to change a wavelength of light emitted from the semiconductor light emitting device.

The semiconductor light emitting device according to embodiments may be packaged in, for example, a semiconductor substrate, an insulating substrate, or a ceramic substrate (such as resin material or silicon).

The semiconductor light emitting device according to the embodiments can be applied to a backlight unit.

The backlight unit can be adapted to a display apparatus such as a liquid crystal display to supply light to the display apparatus. The backlight unit may include a light supply part, a light guide plate, and an optical sheet. The light emitting device package according to the embodiment can be adapted to the light supply part. The backlight unit may not employ the light guide plate.

The semiconductor light emitting device according to the embodiments can be applied to an illumination device.

The illumination device may include a case and a light supply module. The light supply module may be disposed in the case. The light emitting device package according to the embodiments can be adapted to the light supply module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first conductive semiconductor layer;
a first electrode layer below the first conductive semiconductor layer;
a semiconductor layer at an outer peripheral portion of the first conductive semiconductor layer;
an active layer on the first conductive semiconductor layer;
a second conductive semiconductor layer on the active layer; and
a second electrode layer on the second conductive semiconductor layer,
wherein a portion of the semiconductor layer is disposed under a portion of the first conductive semiconductor layer and the semiconductor layer has a carrier concentration lower than a carrier concentration of the first conductive semiconductor layer.

2. The semiconductor light emitting device according to claim 1, wherein the semiconductor layer is not vertically overlapped with the first electrode layer.

3. The semiconductor light emitting device according to claim 1, wherein the semiconductor layer includes an undoped semiconductor layer.

4. The semiconductor light emitting device according to claim 1, wherein the semiconductor layer is spaced apart from the active layer.

5. The semiconductor light emitting device according to claim 1, wherein the first conductive semiconductor layer includes a first electrode contact layer and a first conductive nitride layer.

6. The semiconductor light emitting device according to claim 5, wherein the first electrode contact layer is disposed on the first electrode layer and at a lateral side of the semiconductor layer.

7. The semiconductor light emitting device according to claim 5, wherein the first conductive nitride layer has a carrier concentration higher than a carrier concentration of the semiconductor layer.

8. The semiconductor light emitting device according to claim 5, wherein the first electrode contact layer and the first conductive nitride layer have a carrier concentration of about $5\sim9\times10^{18}$ cm$^{-3}$ or above.

9. The semiconductor light emitting device according to claim 5, wherein the semiconductor layer is disposed at a lateral side of the first electrode contact layer and at an outer lower portion of the first conductive nitride layer.

10. The semiconductor light emitting device according to claim 1, further comprising a channel layer disposed between an outer upper portion of the second conductive semiconductor layer and the second electrode layer.

11. The semiconductor light emitting device according to claim 10, wherein the channel layer is formed of conductive material or insulating material.

12. The semiconductor light emitting device according to claim 1, further comprising a conductive support member disposed on the second electrode layer.

13. The semiconductor light emitting device according to claim 1, wherein the semiconductor layer has a carrier concentration of about $1\sim5\times10^{15}$ cm$^{-3}$ or below.

14. The semiconductor light emitting device according to claim 1, wherein the semiconductor layer includes at least one selected from the group consisting of GaN, InN, AlN, InGaN, AlGaN, InAlGaN and AlInN.

15. The semiconductor light emitting device according to claim 1, wherein the semiconductor layer is doped with at least one material selected from the group consisting of Si, Ge, Sn, Se and Te.

16. A semiconductor light emitting device, comprising:
a first conductive semiconductor layer including a first electrode contact layer and a first conductive nitride layer on the first electrode contact layer;
a first electrode layer below the first conductive semiconductor layer;
a semiconductor layer at a lateral side of the first electrode contact layer and at an outer lower portion of the first conductive nitride layer;
an active layer on the first conductive nitride layer;
a second conductive semiconductor layer on the active layer; and
a second electrode layer on the second conductive semiconductor layer,
wherein a portion of the semiconductor layer is disposed under a portion of the first conductive semiconductor layer and the semiconductor layer has a carrier concentration lower than a carrier concentration of the first conductive nitride layer.

17. The semiconductor light emitting device according to claim 16, wherein the semiconductor layer is not vertically overlapped with the first electrode layer.

18. The semiconductor light emitting device according to claim 16, wherein the first electrode contact layer and the first conductive nitride layer have a carrier concentration of about $5\sim9\times10^{18}$ cm$^{-3}$ or above.

19. The semiconductor light emitting device according to claim 16, wherein the semiconductor layer has a carrier concentration of about $1\sim5\times10^{15}$ cm$^{-3}$ or below.

20. The semiconductor light emitting device according to claim 16, wherein the semiconductor layer is doped with at least one material selected from the group consisting of Si, Ge, Sn, Se and Te.

* * * * *